(12) United States Patent  (10) Patent No.: US 7,804,869 B2
Freund                     (45) Date of Patent:    Sep. 28, 2010

(54) GALLIUM NITRIDE BASED SEMICONDUCTOR DEVICE WITH ELECTRON BLOCKING LAYER

(75) Inventor: Joseph Michael Freund, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 480 days.

(21) Appl. No.: 11/419,592

(22) Filed: May 22, 2006

(65) Prior Publication Data

US 2007/0268948 A1    Nov. 22, 2007

(51) Int. Cl.
*H01S 5/00* (2006.01)
(52) U.S. Cl. .............. 372/45.012; 372/45.01; 372/46.01; 372/43.01
(58) Field of Classification Search .......... 372/45.01, 372/45.012, 46.01, 43.01
See application file for complete search history.

(56) References Cited

U.S. PATENT DOCUMENTS

| 5,073,805 | A | 12/1991 | Nomura et al. | |
|---|---|---|---|---|
| 5,448,585 | A * | 9/1995 | Belenky et al. | 372/45.01 |
| 6,515,308 | B1 * | 2/2003 | Kneissl et al. | 257/86 |
| 6,891,268 | B2 | 5/2005 | Tomiya et al. | |
| 2004/0099869 | A1 * | 5/2004 | Gaska et al. | 257/79 |
| 2005/0230695 | A1 | 10/2005 | Takayama | |

OTHER PUBLICATIONS

J.F. Muth et al., "Absorption Coefficient and Refractive Index of GaN, A1N and A1GaN Alloys," MRS Internet J. Nitride Semicond. Res. 4S1, G5.2, 6 pages, 1999.
S. Nakamura, "Current Status and Future Prospects of InGaN-Based Laser Diodes," JSAP International, No. 1, pp. 5-17, Jan. 2000.
W. Shan et al., "Dependence of the Fundamental Band Gap of $Al_xGa_{1-x}N$ on Alloy Composition and Pressure," Materials Sciences Division, Journal of Applied Physics, vol. 85, Issue 12, 4 pages, Jun. 15, 1999.
M. Hansen et al., "Effect of A1GaN/GaN Stained Layer Superlattice Period on InGaN MQW Laser Diodes," MRS Internet J. Nitride Semicond. Res. 5S1, W1.4, 6 pages, 2000.
P. Abraham et al., "Effects of an InGaP Electron Barrier Layer on 1.55μm Laser Diode Performance," 10th Intern. Conf. on Indium Phosphide and Related Materials, ThP-51, pp. 713-716, May 1998.

(Continued)

*Primary Examiner*—Minsun Harvey
*Assistant Examiner*—Kinam Park
(74) *Attorney, Agent, or Firm*—Ryan, Mason & Lewis, LLP

(57) ABSTRACT

A semiconductor device comprises an n-side waveguide layer, an active layer in contact with the n-side waveguide layer and a p-side waveguide layer in contact with the active layer. An electron blocking layer is in contact with the p-side waveguide layer and comprises a first composition of two elements from group III of the periodic table and an element from group V of the periodic table. A cladding layer includes a cladding sublayer that is in contact with the electron blocking layer. The cladding sublayer comprises a second composition of two elements from group III of the periodic table and an element from group V of the periodic table. The second composition is different from the first composition.

22 Claims, 3 Drawing Sheets

OTHER PUBLICATIONS

Y-K. Kuo et al, "Effects of Electronic Current Overflow and Inhomogeneous Carrier Distribution on InGaN Quantum-Well Laser Performance," IEEE Journal of Quantum Electronics, vol. 40, No. 5, pp. 437-444, May 2004.

K. Takemasa et al., "Effects of a p-AlInAs Electron Stopper Layer in 1.3μm AlGaInAs/InP Strained Multiple Quantum Well Lasers," 10th Intern. Conf. on Indium Phosphide and Related Materials, FA3-4, pp. 835-838, May 1998.

C. Skierbiszewski et al., "High Power Blue-Violet InGaN Laser Diodes Grown on Bulk GaN Substrates by Plasma-Assisted Molecular Beam Epitaxy," Institute of Physics Publishing, Semiconductor Science and Technology, vol. 20, pp. 809-813, 2005.

K.A. Black et al., "Improved Luminescence from InGaAsP/InP MQW Active Regions Using a Wafer Fused Superlattice Barrier," 11th International Conference on Indium Phosphide and Related Materials, TuB4-3, pp. 357-360, May 1999.

T. Asano et al., "100-mW Kink-Free Blue-Violet Laser Diodes with Low Aspect Ratio," IEEE Journal of Quantum Electronics, vol. 39, No. 1, pp. 135-140, Jan. 2003.

S.-W. Hsieh et al., "A Numerical Study of Characteristic Temperature of Short-Cavity 1.3μm AlGaInAs/InP MQW Lasers," Applied Physics A, Materials Science & Processing, vol. 82, pp. 287-292, 2006.

C-Y. Luo et al., "Simulation of InGaN Quantum Well Laser Performance Using Quaternary InAlGaN Alloy as Electronic Blocking Layer," Japanese Journal of Applied Physics vol. 44, No. 11, pp. 7916-7918, 2005.

J. Piprek, et al., "What Limits the Maximum Output Power of Long-Wavelength AlGaInAs/InP Laser Diodes?" IEEE Journal of Quantum Electronics, vol. 38, No. 9, pp. 1253-1259, Sep. 2002.

* cited by examiner

GALLIUM NITRIDE BASED SEMICONDUCTOR DEVICE WITH ELECTRON BLOCKING LAYER

FIELD OF THE INVENTION

This invention relates generally to semiconductor devices and, more particularly, to gallium nitride based semiconductor devices.

BACKGROUND OF THE INVENTION

Gallium nitride (GaN) based blue-violet semiconductor lasers are likely to have far reaching technological and commercial effects. These semiconductor lasers emit near 400 nanometers, about half the wavelength of typical gallium arsenide (GaAs) based semiconductor lasers. The shorter wavelengths allow GaN based semiconductor lasers to achieve higher spatial resolution in applications such as optical storage and printing. Blu-ray Disc (trademark) and High Density Digital Versatile Disc (HD-DVD) (trademark) are, for example, next-generation optical disc formats that utilize blue-violet semiconductor lasers for the storage of high-definition video and data.

GaN based blue-violet semiconductor lasers typically comprise a multilayer semiconductor structure formed on a substrate (e.g., sapphire), and electrical contacts that facilitate the application of an electrical voltage to a portion of the multilayer structure. FIG. 1A shows a sectional view of a conventional GaN based semiconductor laser 100, while FIG. 1B shows the relative conduction band levels, Ec, of various constituent layers and sublayers under typical operating bias conditions. The semiconductor laser comprises a sapphire substrate 110, an n-type gallium nitride (n-GaN) base layer 120, an n-type aluminum gallium nitride (n-AlGaN) cladding layer 130 and an n-side undoped GaN waveguide layer 140. A multiple quantum well (MQW) active layer 150 is formed on top of the n-side waveguide layer. These quantum wells comprise three indium gallium nitride (InGaN) well sublayers 152 separated by GaN barrier sublayers 154. A p-type aluminum gallium nitride (p-AlGaN) electron blocking layer 160 is formed on the active layer, followed by a p-side undoped GaN waveguide layer 170 and a p-type stressed layer superlattice (SLS) cladding layer 180. The SLS cladding layer comprises alternating sublayers of p-AlGaN and p-GaN, 182 and 184, respectively.

Two electrical contacts 190, 195 are operative to allow the application of electrical voltage to the semiconductor laser 100. The applied electrical voltage causes electrons and holes to be injected into the MQW active layer 150. Some of these injected electrons and holes are trapped by the quantum wells and recombine, generating photons of light. By reflecting some of the generated light from facets formed at two opposing vertical surfaces of the semiconductor laser (not shown), some photons are made to pass through the MQW active layer several times, resulting in stimulated emission of radiation.

The waveguide layers 140, 170 form an optical film waveguide in the semiconductor laser 100 and serve as local reservoirs for electrons and holes for injection into the MQW active layer 150. The optical film waveguide, in turn, is completed by cladding layers 130, 180 which have a lower index of refraction than the waveguide layers. The cladding layers act to further restrict the generated light to the MQW active layer of the semiconductor laser.

As shown in FIG. 1B, the electron blocking layer 160 in the semiconductor laser 100 is configured to have a relatively high conduction level, Ec. The electron blocking layer, thereby, forms a potential barrier that acts to suppress the flow of electrons from the MQW active layer 150. Advantageously, this reduces the threshold current of the semiconductor laser (the minimum current at which stimulated emission occurs), allowing for a higher maximum output power. Electron blocking layers are described for use in GaAs based semiconductor lasers in, for example, U.S. Pat. No. 5,448,585 to Belenky et al., entitled "Article Comprising a Quantum Well Laser," which is incorporated herein by reference. Nevertheless, the implementation of electron blocking layers in GaN based semiconductor lasers is problematic. Electron blocking layers located between the MQW active layer and one of the waveguide layers have been shown to cause excessive physical stress on the active layer which may, in turn, cause cracking.

As a response, attempts have been made to move the electron blocking layer away from the MQW active layer and into the p-side waveguide layer. Asano et al. in "100-mV Kink-Free Blue-Violet Laser Diodes with Low Aspect Ratio," IEEE Journal of Quantum Electronics, Vol. 39, No. 1, January 2003, also incorporated herein by reference, for example, demonstrates the use of a p-AlGaN electron blocking layer formed in a p-side waveguide layer of a semiconductor laser similar to the semiconductor laser 100 shown in FIG. 1. Unfortunately, however, such efforts have shown limited success in reducing the physical stress in the MQW active layer. Stress induced cracking still remains an issue for GaN based semiconductor lasers.

There is, as a result, a need for a GaN based blue-violet semiconductor laser design that includes an electron blocking layer without the concomitant physical stress on the active layer.

SUMMARY OF THE INVENTION

Embodiments of the present invention address the above-identified need by allowing electron blocking layers to be implemented in semiconductor lasers without inducing excessive physical stress in the lasers' active layers.

In accordance with an aspect of the invention, a semiconductor device comprises an n-side waveguide layer, an active layer in contact with the n-side waveguide layer and a p-side waveguide layer in contact with the active layer. An electron blocking layer is in contact with the p-side waveguide layer and comprises a first composition of two elements from group III of the periodic table and an element from group V of the periodic table. A cladding layer includes a cladding sublayer that is in contact with the electron blocking layer. The cladding sublayer comprises a second composition of two elements from group III of the periodic table and an element from group V of the periodic table. The second composition is different from the first composition.

In accordance with another aspect of the invention, a semiconductor device comprises an n-side waveguide layer, an active layer in contact with the n-side waveguide layer and a p-side waveguide layer in contact with the active layer. An electron blocking layer is in contact with the p-side waveguide layer and comprises a composition of three elements from group III of the periodic table and an element from group V of the periodic table. A cladding layer includes a cladding sublayer that is in contact with the electron blocking layer. The cladding sublayer comprises a composition of two elements from group III of the periodic table and an element from group V of the periodic table.

In an illustrative embodiment, a semiconductor laser is formed from various layers and sublayers comprising doped and undoped AlGaN, GaN and InGaN. Two of the constituent layers comprise a p-AlGaN electron blocking layer and a p-type SLS cladding layer. The SLS cladding layer includes a cladding sublayer that is in contact with the electron blocking layer. The cladding sublayer comprises p-AlGaN having a lower atomic percentage of aluminum than the p-AlGaN forming the electron blocking layer. This configuration causes the electron blocking layer to have a conduction band level that is substantially higher (e.g., more than about 50 millielectron volts higher) than that of the adjacent p-AlGaN sublayer in the SLS cladding layer.

Advantageously, the illustrative semiconductor laser exhibits the benefits of an electron blocking layer (e.g., lower threshold current) but does not suffer from excessive physical stress that can lead to cracking.

These and other features and advantages of the present invention will become apparent from the following detailed description which is to be read in conjunction with the accompanying figures.

DETAILED DESCRIPTION OF THE INVENTION

The present invention will be described with reference to illustrative embodiments in accordance with aspects of the invention. Nevertheless, the invention is not limited to these particular embodiments. Numerous modifications and variations can be made to the embodiments described herein and the results will still come under the scope of this invention. For example, while the illustrative embodiments are semiconductor lasers, the invention also encompasses light emitting diodes, photodetectors, optical couplers and other such semiconductor devices. Therefore, no limitations with respect to the specific embodiments described are intended or should be inferred.

Figure 1A:
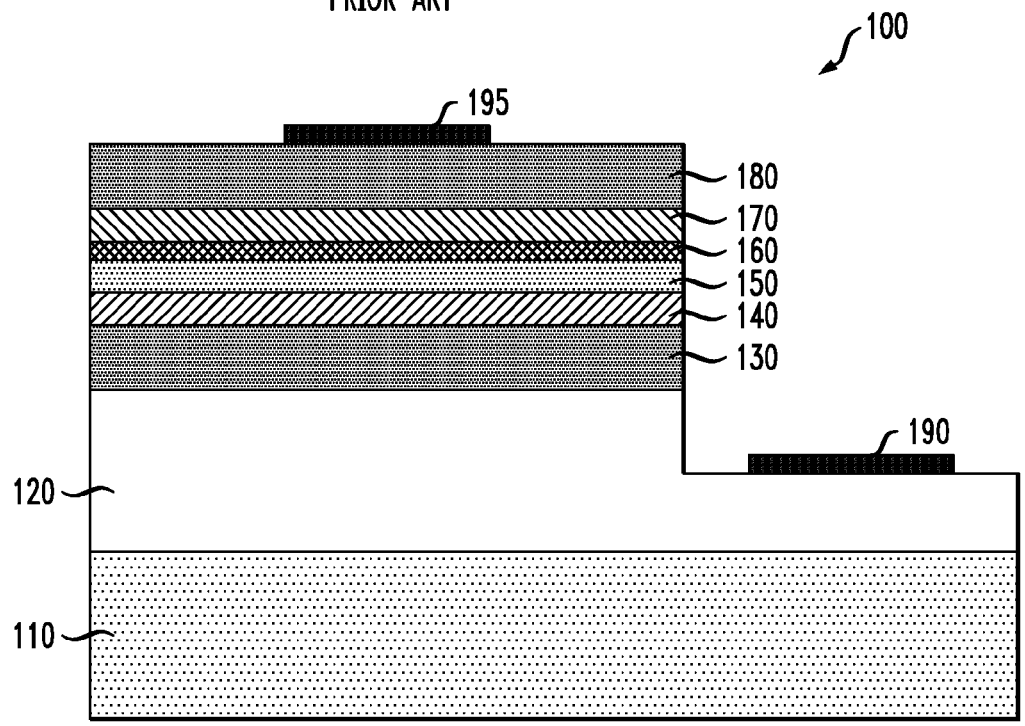
FIG. 1A shows a sectional view of a GaN based semiconductor laser in accordance with the prior art.
Figure 1B:
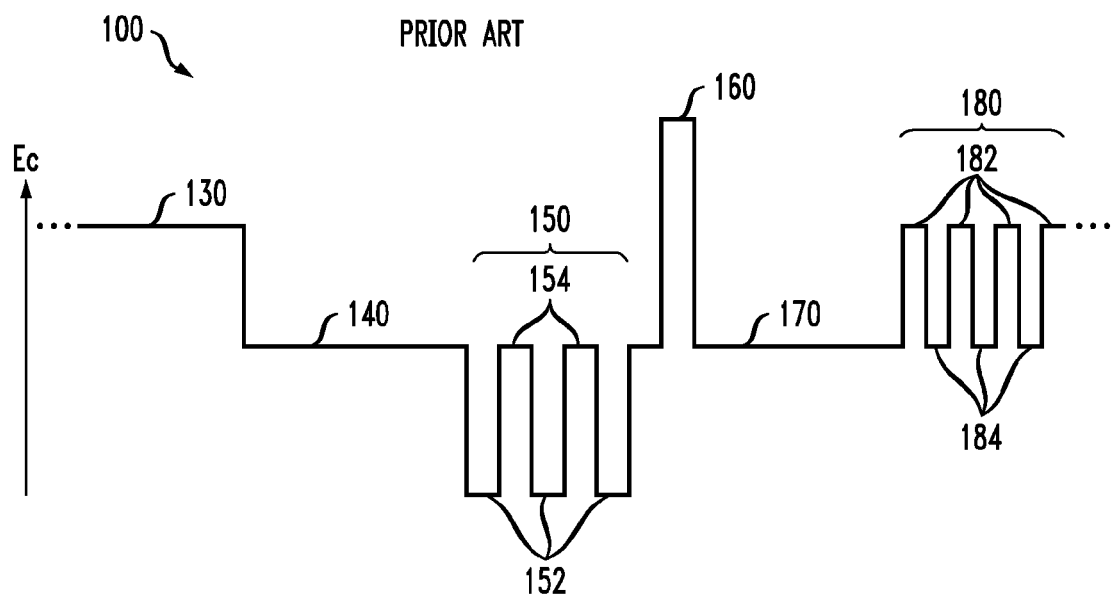
FIG. 1B shows the conduction band levels of various layers and sublayers within the FIG. 1A semiconductor laser.
Figure 2A:
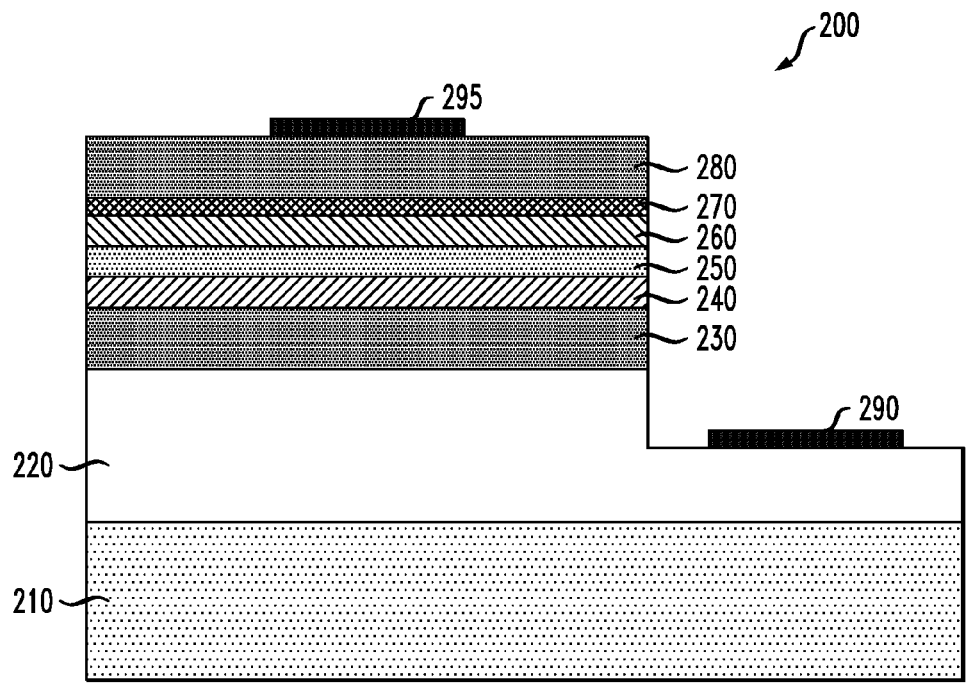
FIG. 2A shows a sectional view of a GaN based semiconductor laser in accordance with an illustrative embodiment of the invention.

It should be noted that the term "layer" as utilized herein is intended to encompass any stratum of matter with a given function or functions within a semiconductor device. A layer may be substantially homogenous in composition or may comprise two or more sublayers with differing compositions. For ease of understanding, several layers in FIGS. 1A and 2A are represented as single features when, in fact, they comprise a plurality of sublayers of differing compositions.

The term "periodic table" as used herein refers to the periodic table of the chemical elements. Group III, as used herein, comprises the elements of boron, aluminum, gallium, indium and thallium. Group V, as used herein, comprises the elements of nitrogen, phosphorus, arsenic, antimony and bismuth.

What is more, as is conventional, expressions such as "InGaN," and "AlGaN" are not chemical formulas, but are instead merely recitations of constituent elements. Thus, for example, the expression "InGaN" is to be understood to encompass the ternary alloy $In_xGa_{1-x}N$ while "AlGaN" encompasses the ternary alloy $Al_xGa_{1-x}N$.

The various layers and/or regions shown in the accompanying figures are not drawn to scale and one or more layers and/or regions of a type commonly used in semiconductor devices may not be explicitly shown in a given figure for ease of explanation. This does not imply that the layer(s) and/or regions(s) not explicitly shown are omitted from the actual semiconductor devices.

Figure 2B:
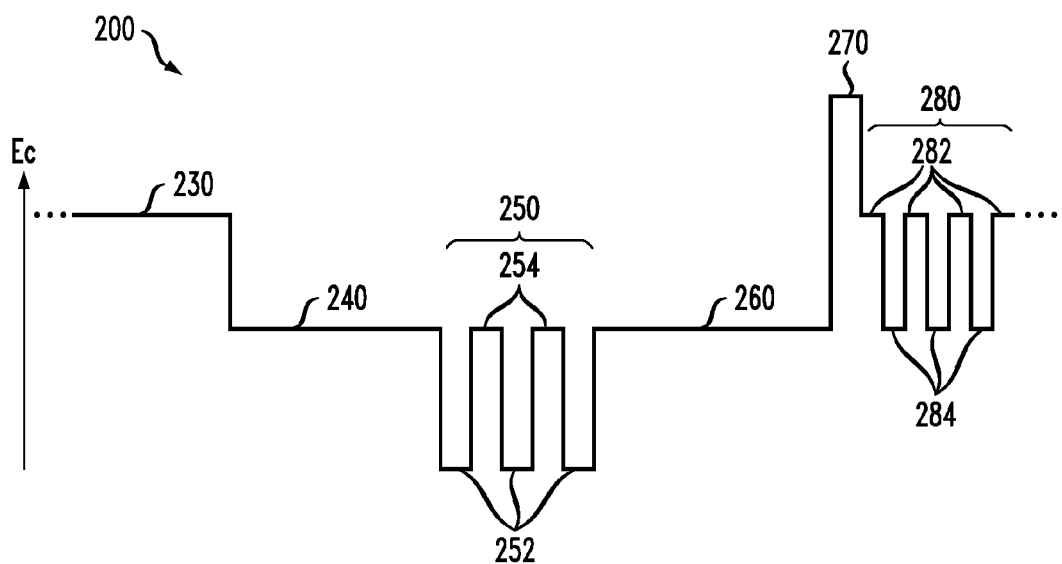
FIG. 2B shows the conduction band levels of various layers and sublayers within the FIG. 2A semiconductor laser.

FIG. 2A shows a sectional view of a GaN based semiconductor laser 200 in accordance with an illustrative embodiment of the invention. In addition, FIG. 2B shows the relative conduction band levels, Ec, of various layers and sublayers within the semiconductor laser under operating bias conditions. The semiconductor laser comprises a sapphire substrate 210, a 5,000-nanometer (nm) thick n-GaN base layer 220 and a 1,300-nm thick n-AlGaN cladding layer 230. An MQW active layer 250 is formed between a 100-nm thick n-side undoped GaN waveguide layer 240 and a 100-nm thick p-side undoped GaN waveguide layer 260. A 12-nm thick p-AlGaN electron blocking layer 270 is formed adjacent to a p-type SLS cladding layer 280. Electrical contacts 290, 295 allow an electrical voltage to be applied to a portion of the semiconductor laser.

The MQW active layer 250, in turn, comprises three 3.5-nm thick InGaN well sublayers 252 separated by two 7-nm thick GaN barrier sublayers 254. The SLS cladding layer 280, on the other hand, comprises 100 2.5-nm thick p-AlGaN sublayers 282 separated by 2.5-nm thick p-GaN sublayers 284. In accordance with an aspect of the invention, the p-AlGaN sublayers in the SLS cladding layer comprise p-AlGaN with a composition having a lower atomic percentage of aluminum (or, alternatively, a lower concentration of aluminum) than the p-AlGaN of the electron blocking layer 270. Moreover, one of the p-AlGaN sublayers in the SLS cladding layer is placed so that it is in physical contact with the electron blocking layer.

In the illustrative embodiment, the n-GaN base layer 220 and the n-AlGaN cladding layer 230 are doped with silicon. In contrast, the p-AlGaN electron blocking layer 270 and the p-AlGaN and p-GaN sublayers 282, 284 are doped with magnesium. It is advantageous to use a multilayer p-AlGaN/p-GaN SLS structure for the p-type cladding layer 280 rather than bulk p-AlGaN for several reasons. Firstly, the multilayer SLS structure has been shown to reduce physical stress in the cladding layer when compared to cladding layers comprising bulk p-AlGaN. Secondly, the multilayer SLS structure has been shown to comprise an enhanced hole concentration. The average hole concentration of a multilayer SLS cladding layer at room temperature may be a factor of ten higher than the concentration in bulk films (e.g., bulk p-AlGaN doped with magnesium).

The p-AlGaN electron blocking layer 270 is configured to provide a potential barrier for the flow of electrons from the MQW active layer 250 and p-side waveguide layer 260 into the SLS cladding layer 280. This is achieved by configuring the composition of the electron blocking layer such that the layer has a large bandgap and, as a result, a relatively high conduction band level, Ec. The band gap of $Al_xGa_{1-x}N$ can be readily modified by changing the value of x. Generally, the higher the relative aluminum content (i.e., the higher the value of x), the higher is the bandgap of the material. The bandgap of $Al_xGa_{1-x}N$ as a function of x is described in, for example, J. F. Muth et al., "Absorption Coefficient and Refractive Index of GaN, AlN and AlGaN Alloys," MRS Internet Journal of Nitride Semiconductor Research 4S1, G5.2 (1999), which is incorporated herein by reference. According to this reference, binary aluminum nitride ($Al_1N_1$), for example, has a bandgap of about 6.20 electron volts. Binary gallium nitride ($Ga_1N_1$), on the other hand, has a bandgap of only about 3.43 electron volts. The ternary alloy $Al_{0.27}Ga_{0.73}N$ has a band gap of 4.00 electron volts.

While the p-AlGaN electron blocking layer 270 is designed to provide a potential barrier for the flow of electrons, it should not be understood to mean that the presence of the electron blocking layer completely stops all electron flow past the layer. Instead, the electron blocking layer causes at least a substantially lower flow of electrons at device operating temperature and bias when compared to the flow of electrons observed in an otherwise identical semiconductor laser that does not comprise the electron blocking layer. The p-AlGaN electron blocking layer will preferably have a conduction band level that is at least about 50 millielectron volts higher than the conduction band level of the p-side waveguide layer 260. What is more, the electron blocking layer will preferably have a thickness equal to or greater than about ten nanometers. Thinner electron blocking layers may suffer from significant amounts of electron tunneling and leakage.

Advantageously, configuring the electron blocking layer 270 and the SLS cladding layer 280 in accordance with aspects of the invention allows the electron blocking layer to be implemented in the semiconductor laser 200 without inducing excessive physical stress on the laser's MQW active layer 250. In the illustrative semiconductor laser, the p-AlGaN electron blocking layer is separated from the MQW active layer by the p-side waveguide layer 260. There is, in this way, physical separation between the electron blocking layer and the MQW active layer. Moreover, as described earlier, the p-AlGaN electron blocking layer is adjacent to one of the p-AlGaN sublayers 282 within the SLS cladding layer 280. Generally, much of the physical stress in GaN based semiconductor lasers is induced by lattice mismatches between adjacent layers and sublayers. By configuring the electron blocking layer and SLS cladding layer in the way shown in FIGS. 2A and 2B, a progressive transition from higher aluminum content p-AlGaN to lower aluminum content p-AlGaN to p-GaN (no aluminum content) is created near the interface of the electron blocking layer and the SLS cladding layer. This reduces the severity of lattice mismatches between these adjacent layers and sublayers and, thereby, reduces the overall physical stress in the semiconductor laser when compared to conventional semiconductor lasers like semiconductor laser 100 shown in FIG. 1A.

It should be noted that the above-described design of the semiconductor laser 200 is illustrative and that many other designs would still come within the scope of this invention. For example, it may be advantageous to form the MQW active layer 250 from alternating sublayers of InGaN of a first composition and InGaN of second composition, or to form the layers and sublayers constituting the semiconductor laser with thicknesses very different from those explicitly described herein. What is more, it may be advantageous to form the electron blocking layer 270 from a ternary III-V compound other than AlGaN such as, but not limited to, indium gallium phosphide (InGaP). If InGaP is utilized for the electron blocking layer, the SLS cladding sublayers 282, 284 may comprise, for example, InGaP with a lower band gap than that used to form the electron blocking layer and indium phosphide, respectively. These and other variations on the illustrative embodiment will be evident to those skilled in the art.

It may also be desirable to form the electron blocking layer 270 from something other than a ternary III-V compound, such as a quaternary III-V compound like indium aluminum gallium nitride (InAlGaN) (e.g., $In_{0.05}Al_{0.25}Ga_{0.7}N$). Like AlGaN, InAlGaN can be formed with a band gap sufficient to create a potential barrier for the flow of electrons from the MQW active layer 250 and the p-side GaN waveguide layer 260 into the SLS cladding layer 280. Moreover, InAlGaN layers may also be formed with a lattice constant similar to that of GaN. In this way, the any lattice mismatch between the p-side GaN waveguide layer 260 and the electron blocking layer can be minimized.

Figure 3:
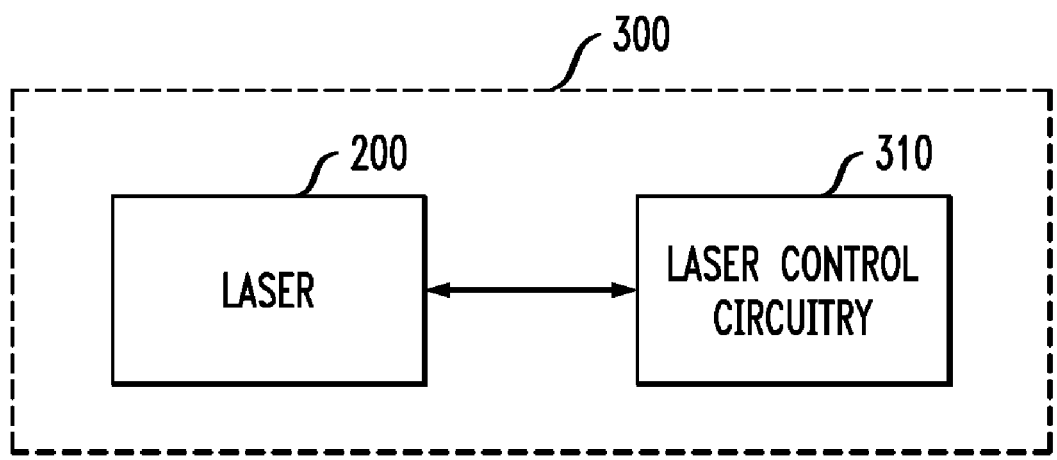
FIG. 3 shows a block diagram of the FIG. 2A semiconductor laser implemented in an optical device in accordance with an illustrative embodiment of the invention.

FIG. 3 shows a block diagram of the implementation of the semiconductor laser 200 in an optical device 300 in accordance with an illustrative embodiment of the invention. The optical device may be, for example, an optical disc drive with high density data read/write capabilities or, alternatively, a component in a fiber optic communication system. The operation of the semiconductor laser in the optical device is largely conventional and will be familiar to one skilled in the art. Moreover, the operation of semiconductor lasers is described in detail in a number of readily available references such as, for example, P. Holloway et al., *Handbook of Compound Semiconductors*, William Andrews Inc., 1996, and E. Kapon, *Semiconductor Lasers II*, Elsevier, 1998, which are incorporated herein by reference.

As described earlier, the semiconductor laser 200 is powered by applying an electrical control voltage across the electrical contacts 290, 295. Generally, the greater the amount of control voltage applied to the electrical contacts, the greater the amount of stimulated emission that occurs in this MQW active layer 250 of the semiconductor laser and the greater the amount of light output. In the optical device 300, it is control circuitry 310 that applies the control voltage to the semiconductor laser's electrical contacts. Precise laser output power may optionally be maintained by use of one or more monitor photodiodes that measure the output power of the semiconductor laser and feed this measurement back to the control circuitry. The control circuitry may be a discrete portion of circuitry within the optical device or may be, in contrast, integrated into the device's other circuitry.

The semiconductor laser 200 is preferably formed by sequentially depositing the layers shown in FIG. 2A from bottom to top as shown in the figure using conventional semiconductor processing techniques that will be familiar to one skilled in that art. Because of the large lattice mismatch (about 15%) between sapphire and GaN, the n-GaN base layer 220 is preferably formed on the sapphire substrate 210 using what is commonly referred to as "epitaxial lateral overgrowth" (ELO). In the ELO process, the sapphire is first coated with a thin silicon dioxide mask that is patterned to expose repeating stripes of the sapphire surface that run in the GaN<1100> direction. The n-GaN base layer is then deposited by metal organic chemical vapor deposition (MOCVD) on the exposed sapphire. During deposition, the n-GaN coalesces to form a high quality bulk film with few defects.

The remaining films are then deposited sequentially using steps comprising MOCVD. The MOCVD deposition technique (also called metal oxide vapor phase epitaxy) is conventionally used in semiconductor processing and will be familiar to one skilled in that art. In MOCVD, the film stack onto which deposition is to occur is exposed to organic compounds (i.e., precursors) containing the required chemical elements. For example, metal organic compounds such as trimethyl gallium or trimethyl aluminum, in combination with reactants such as ammonia, may be utilized. The process consists of transporting the precursors via a carrier gas to a hot zone within a growth chamber. These precursors either dissociate or react with another compound to produce thin films. Dopant reactants may be added to form doped films.

Reactors are commercially available for the MOCVD of the compound III-V materials described herein. Veeco Instruments Inc. (corporate headquarters in Woodbury, N.Y.), for example, produces and markets such reactors for both research and development and commercial semiconductor device manufacturing.

It should be noted that the invention is not limited to the deposition of the materials by MOCVD. Molecular beam epitaxy (MBE) is also capable of forming compound III-V materials like those described herein. In MBE, materials are deposited as atoms or molecules in a beam of gas onto the substrate. Typically, each material is delivered in a separately controlled beam, so the choice of elements and their relative concentrations may be adjusted for any given layer, thereby defining the composition and electrical characteristics of that layer. Beam intensity is adjusted for precise control of layer thickness, uniformity and purity. Accordingly, semiconductor lasers comprising aspects of the invention formed in whole or in part by methods other than MOCVD, including MBE, would still fall within the scope of the invention.

After forming the film stack, a portion of the film stack is removed using conventional photolithography and reactive ion etching (RIE) techniques so that the electrical contact 290 can be placed in contact with the n-GaN base layer 220. The electrical contacts 290, 295 (e.g., alloys comprising platinum and gold) are then deposited on the exposed n-GaN base layer and on top of the SLS cladding layer 280 by conventional metal evaporation. The multilayer structure is then cleaved to form a discrete semiconductor laser device and, subsequently, facets are formed on two opposing vertical surfaces of the semiconductor laser to act as partially reflective mirrors. The facets may be coated with an anti-reflective film to precisely control the reflectivity of these mirrors.

It should again be emphasized that, although illustrative embodiments of the present invention have been described herein with reference to the accompanying figures, the invention is not limited to those precise embodiments. A semiconductor device may comprise a different arrangement of elements and be formed by different methods and still come within the scope of the invention. It may be advantageous, for example, to form the electron blocking layer such that it actually has a lower conduction band level in relation to one or more sublayers within the cladding layer. One skilled in the art will recognize various other changes and modifications that may be made without departing from the scope of the appended claims.

What is claimed is:

1. A semiconductor device comprising:
   an n-side waveguide layer;
   an active layer in contact with the n-side waveguide layer;
   a p-side waveguide layer in contact with the active layer;
   an electron blocking layer in contact with the p-side waveguide layer, the electron blocking layer comprising a first composition of two elements from group III of the periodic table and an element from group V of the periodic table; and
   a cladding layer, the cladding layer including a first cladding sublayer in contact with the electron blocking layer and in contact with a second cladding sublayer, the first cladding sublayer being disposed between the second cladding sublayer and the electron blocking layer;
   wherein the first cladding sublayer comprises a second composition of two elements from group III of the periodic table and an element from group V of the periodic table, the second composition being different from the first composition; and
   wherein the first cladding sublayer has a higher conduction band level than the second cladding sublayer.

2. The semiconductor device of claim 1, wherein the semiconductor device comprises a laser.

3. The semiconductor device of claim 1, wherein the electron blocking layer has a higher conduction band level than the first cladding sublayer.

4. The semiconductor device of claim 1, wherein the electron blocking layer is configured to form a potential barrier for the flow of electrons from the active layer and the p-side waveguide layer into the cladding layer.

5. The semiconductor device of claim 4, wherein the potential barrier has a height of at least about 50 millielectron volts.

6. The semiconductor device of claim 1, wherein the electron blocking layer is more than about ten nanometers thick.

7. The semiconductor device of claim 1, wherein the electron blocking layer is doped with magnesium.

8. The semiconductor device of claim 1, wherein the active layer comprises one or more quantum wells.

9. The semiconductor device of claim 1, wherein the cladding layer is a stressed layer superlattice.

10. The semiconductor device of claim 9, wherein the stressed layer superlatice comprises a plurality of sublayers comprising aluminum gallium nitride and a plurality of sublayers comprising gallium nitride.

11. The semiconductor device of claim 1, further comprising two or more electrical contacts operative to allow the flowing of electrical current through at least a portion of the semiconductor device.

12. A semiconductor device comprising:
    an n-side waveguide layer;
    an active layer in contact with the n-side waveguide layer;
    a p-side waveguide layer in contact with the active layer;
    an electron blocking layer in contact with the p-side waveguide layer, the electron blocking layer comprising aluminum gallium nitride of a first composition; and
    a cladding layer, the cladding layer including a first cladding sublayer in contact with the electron blocking layer and in contact with a second cladding sublayer, the first cladding sublayer being disposed between the second cladding sublayer and the electron blocking layer;
    wherein the first cladding sublayer comprises aluminum gallium nitride of a second composition different from the first composition; and
    wherein the first cladding sublayer has a higher conduction band level than the second cladding sublayer.

13. The semiconductor device of claim 12, wherein the aluminum gallium nitride of the second composition has a lower atomic percentage of aluminum than the aluminum gallium nitride of the first composition.

14. The semiconductor device of claim 12, wherein the aluminum gallium nitride of the second composition has a lower concentration of aluminum than the aluminum gallium nitride of the first composition.

15. A method of forming a semiconductor device, the method comprising the steps of:
    forming an n-side waveguide layer;
    forming an active layer in contact with the n-side waveguide layer;
    forming a p-side waveguide layer in contact with the active layer;
    forming an electron blocking layer in contact with the p-side waveguide layer, the electron blocking layer comprising a first composition of two elements from group III of the periodic table and an element from group V of the periodic table; and
    forming a cladding layer, the cladding layer including a first cladding sublayer in contact with the electron blocking layer and in contact with a second cladding sublayer, the first cladding sublayer being disposed between the second cladding sublayer and the electron blocking layer;

wherein the first cladding sublayer comprises a second composition of two elements from group III of the periodic table and an element from group V of the periodic table, the second composition being different from the first composition; and wherein the first cladding sublayer has a higher conduction band level than the second cladding sublayer.

16. The method of claim 15, wherein the method comprises metal organic chemical vapor deposition.

17. The method of claim 15, wherein the method comprises molecular beam epitaxy.

18. The method of claim 15, wherein the method comprises epitaxial lateral overgrowth of gallium nitride on sapphire.

19. An apparatus including:
a semiconductor device comprising:
an n-side waveguide layer;
an active layer in contact with the n-side waveguide layer;
a p-side waveguide layer in contact with the active layer;
an electron blocking layer in contact with the p-side waveguide layer, the electron blocking layer comprising a first composition of two elements from group III of the periodic table and an element from group V of the periodic table; and
a cladding layer, the cladding layer including a first cladding sublayer in contact with the electron blocking layer and in contact with a second cladding sublayer, the first cladding sublayer being disposed between the second cladding sublayer and the electron blocking layer;
wherein the first cladding sublayer comprises a second composition of two elements from group III of the periodic table and an element from group V of the periodic table, the second composition being different from the first composition; and
wherein the first cladding sublayer has a higher conduction band level than the second cladding sublayer; and
control circuitry, the control circuitry operative to control the semiconductor device.

20. The apparatus of claim 19, wherein the apparatus is an optical disc drive capable of operating in accordance with at least one of the Blu-ray Disc format and the High Density Digital Versatile Disc format.

21. A semiconductor device comprising:
an n-side waveguide layer;
an active layer in contact with the n-side waveguide layer;
a p-side waveguide layer in contact with the active layer;
an electron blocking layer in contact with the p-side waveguide layer, the electron blocking layer comprising a composition of three elements from group III of the periodic table and an element from group V of the periodic table; and
a cladding layer, the cladding layer including a first cladding sublayer in contact with the electron blocking layer and in contact with a second cladding sublayer, the first cladding sublayer being disposed between the second cladding sublayer and the electron blocking layer;
wherein the first cladding sublayer comprises a second composition of two elements from group III of the periodic table and an element from group V of the periodic table, the second composition being different from the first composition; and
wherein the first cladding sublayer has a higher conduction band level than the second cladding sublayer.

22. The semiconductor device of claim 21, wherein the electron blocking layer comprises indium aluminum gallium nitride.

* * * * *